(12) United States Patent
Delakowitz

(10) Patent No.: US 7,838,767 B2
(45) Date of Patent: Nov. 23, 2010

(54) MODULAR HOUSING WALL FOR TELECOMMUNICATIONS DEVICES

(75) Inventor: Bernd Delakowitz, Berlin (DE)

(73) Assignee: ADC GmbH, Berlin (DE)

( * ) Notice: Subject to any disclaimer, the term of this patent is extended or adjusted under 35 U.S.C. 154(b) by 392 days.

(21) Appl. No.: 11/995,661

(22) PCT Filed: Jul. 7, 2006

(86) PCT No.: PCT/EP2006/006660

§ 371 (c)(1),
(2), (4) Date: Jan. 14, 2008

(87) PCT Pub. No.: WO2007/006499

PCT Pub. Date: Jan. 18, 2007

(65) Prior Publication Data

US 2008/0203867 A1    Aug. 28, 2008

(30) Foreign Application Priority Data

Jul. 14, 2005    (DE)    ........................ 10 2005 032 872

(51) Int. Cl.
*H01J 5/00* (2006.01)
(52) U.S. Cl. ........................................................ 174/50
(58) Field of Classification Search .................. 174/50, 174/135, 68.1, 68.3, 72 A, 97, 72 C, 480, 174/481; 220/4.02; 439/535, 207; 248/906; 52/220.1
See application file for complete search history.

(56) References Cited

U.S. PATENT DOCUMENTS

| 5,576,513 | A | 11/1996 | Gunther et al. |
| 6,075,207 | A | 6/2000 | Sielaff et al. |
| 6,246,004 | B1 | 6/2001 | Faccin |
| 7,348,488 | B2 * | 3/2008 | Benito-Navazo ......... 174/72 A |
| 7,476,802 | B2 * | 1/2009 | Cane et al. .................... 174/50 |

FOREIGN PATENT DOCUMENTS

| DE | 74 42 583 | 7/1975 |
| DE | 37 43 192 | 6/1989 |
| DE | 92 09 519.4 | 10/1992 |
| DE | 42 23 322 | 7/1993 |
| DE | 43 41 943 | 6/1995 |
| DE | 197 09 460 | 9/1998 |
| DE | 698 019 88 | 5/2002 |
| DE | 101 61 016 | 7/2003 |
| GB | 2 285 388 | 7/1995 |

* cited by examiner

*Primary Examiner*—Dhiru R Patel
(74) *Attorney, Agent, or Firm*—Merchant & Gould P.C.

(57) ABSTRACT

A modular housing wall (1) for telecommunications and data technology devices includes at least one covering element (2) for forming a flat wall section and at least one detent rail (10) for fixing the at least one covering element (2). One example covering element (2) has, at least in part, a U-shaped cross-section with detent elements. One example, detent rail (10) includes notches (13a). The detent elements (5) for hanging the covering element (2) on the detent rail (10) are brought into contact with the notches.

27 Claims, 13 Drawing Sheets

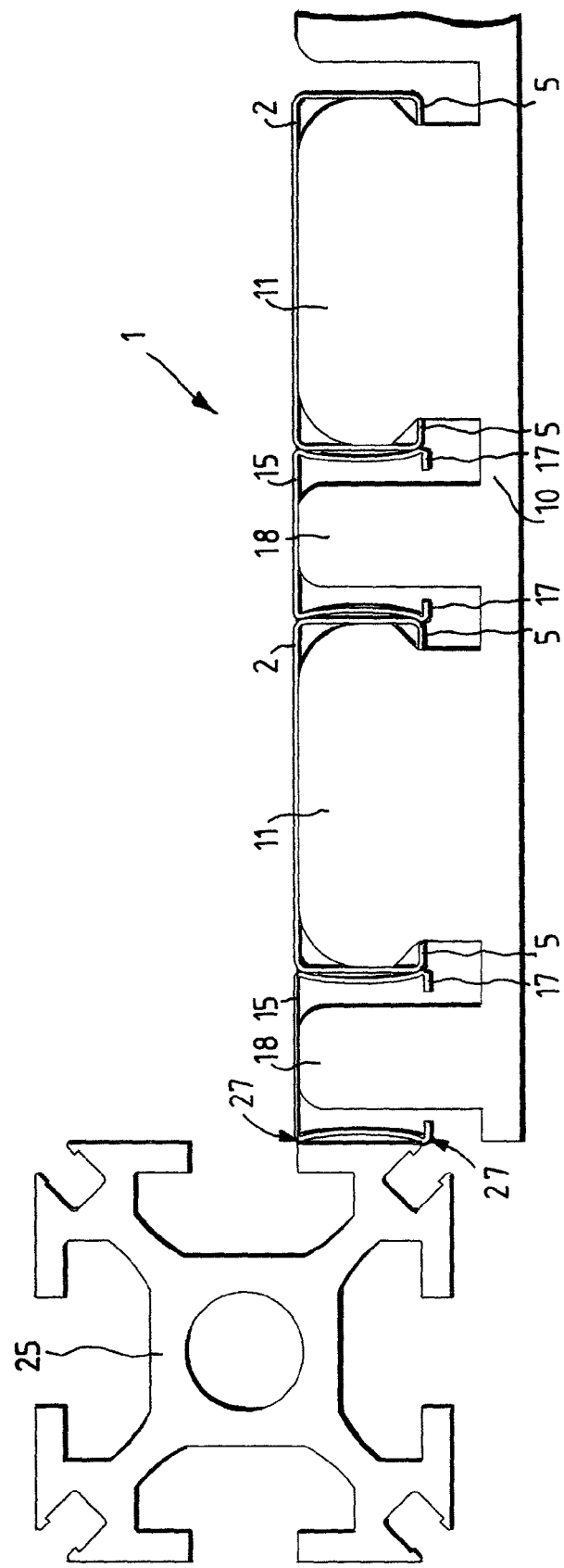

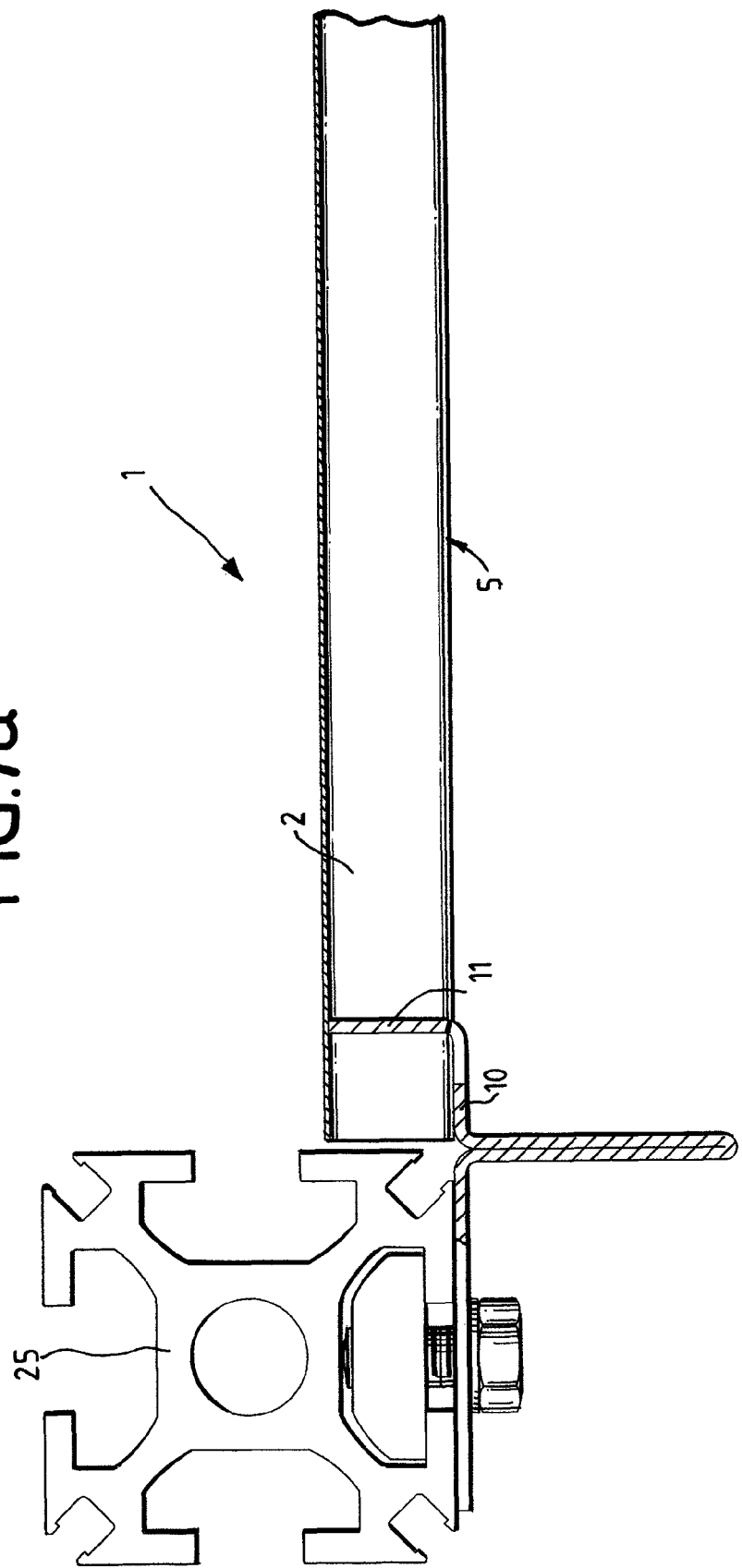

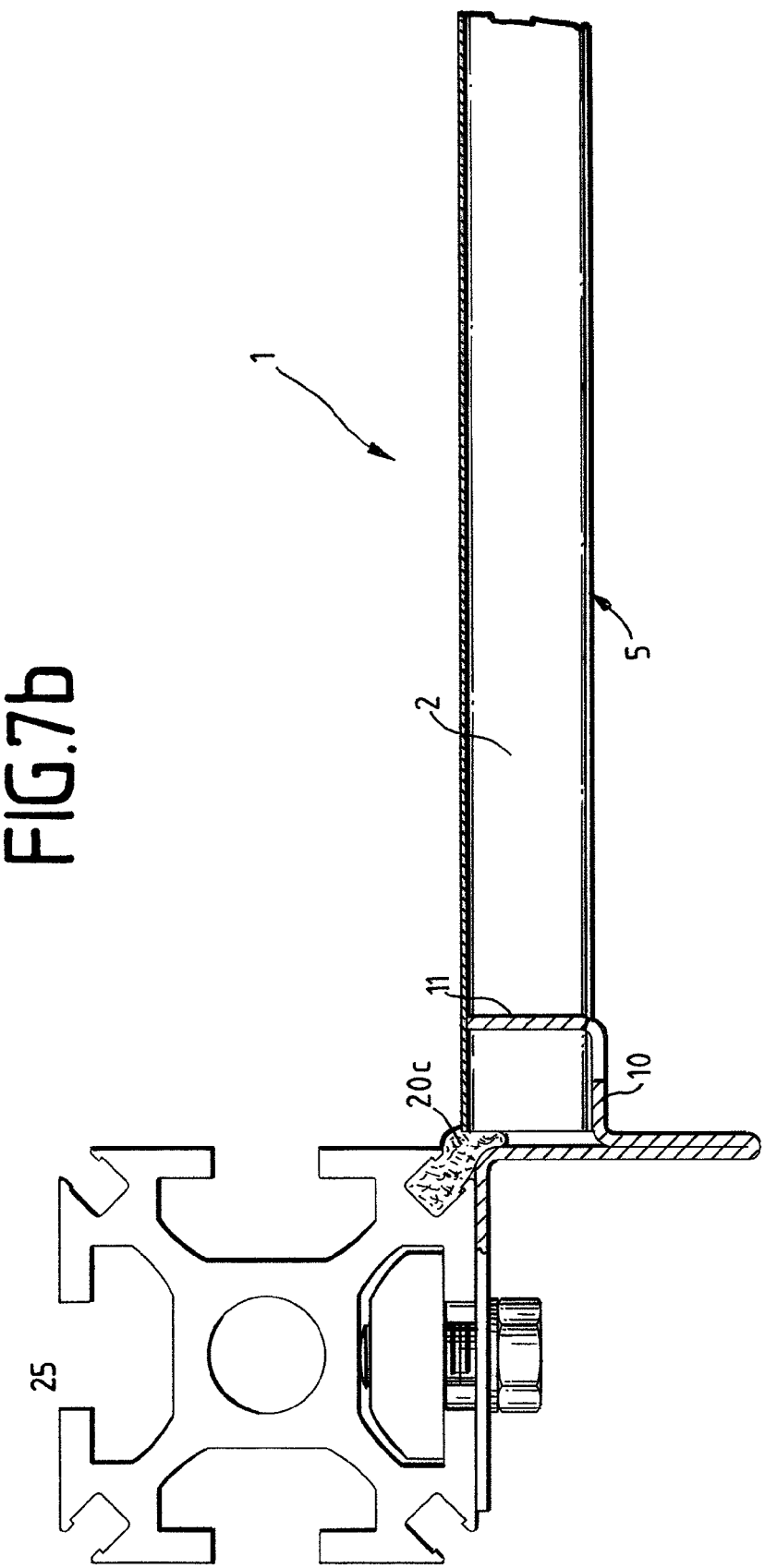

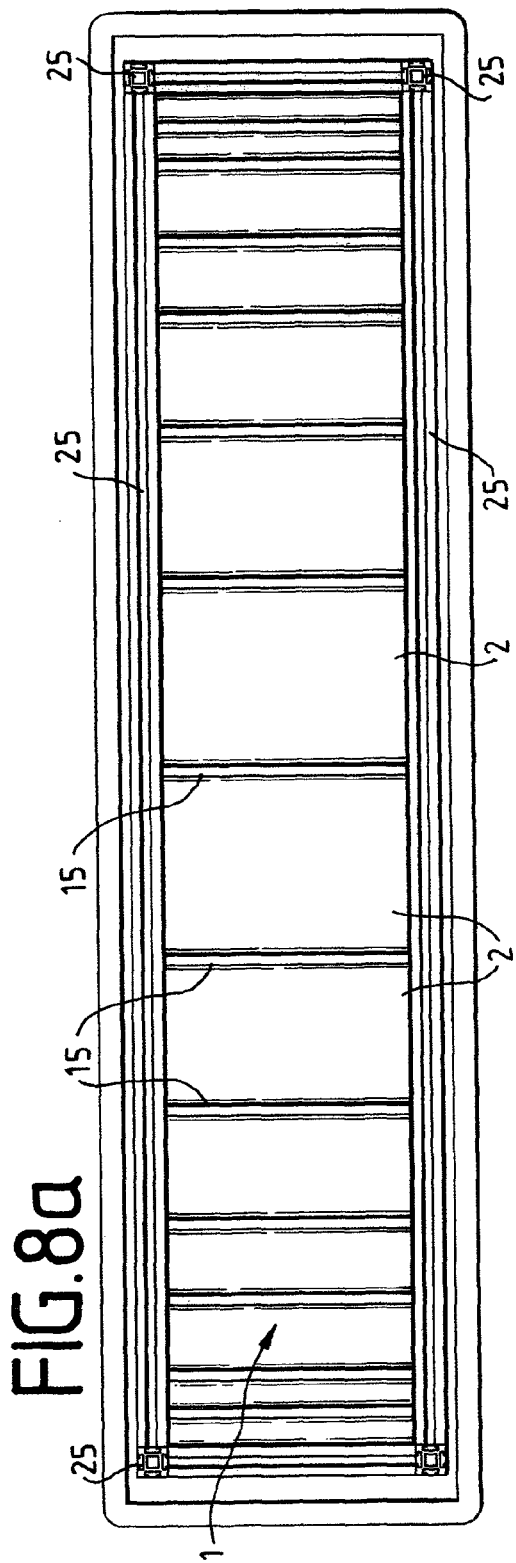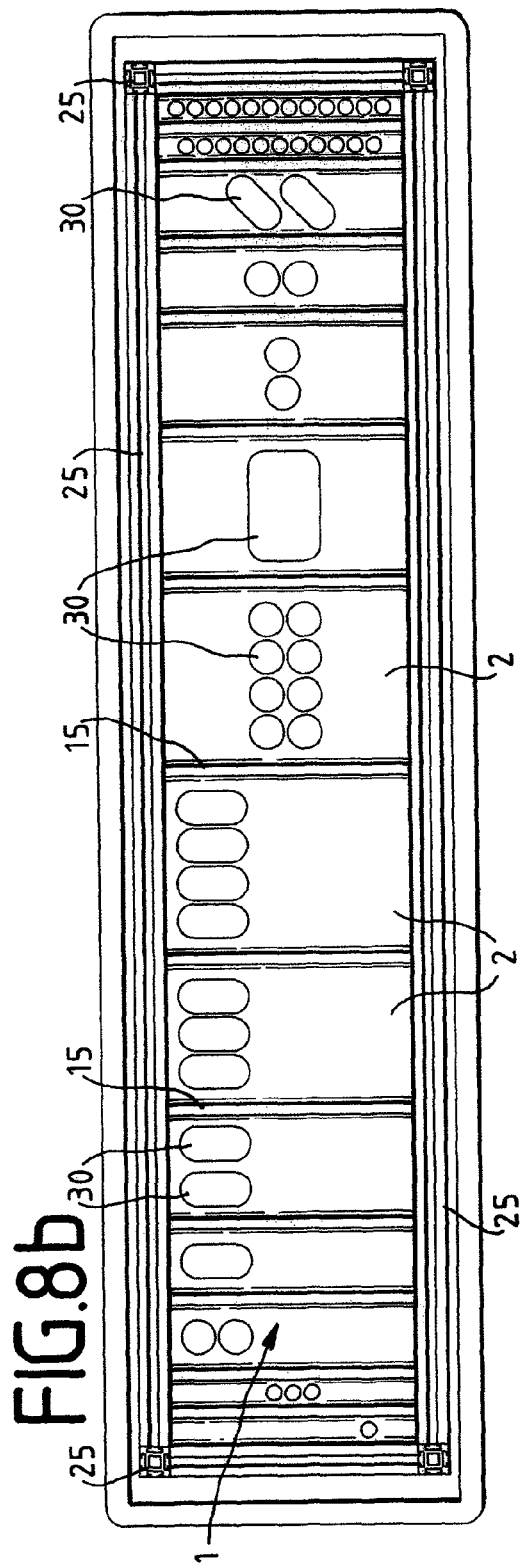

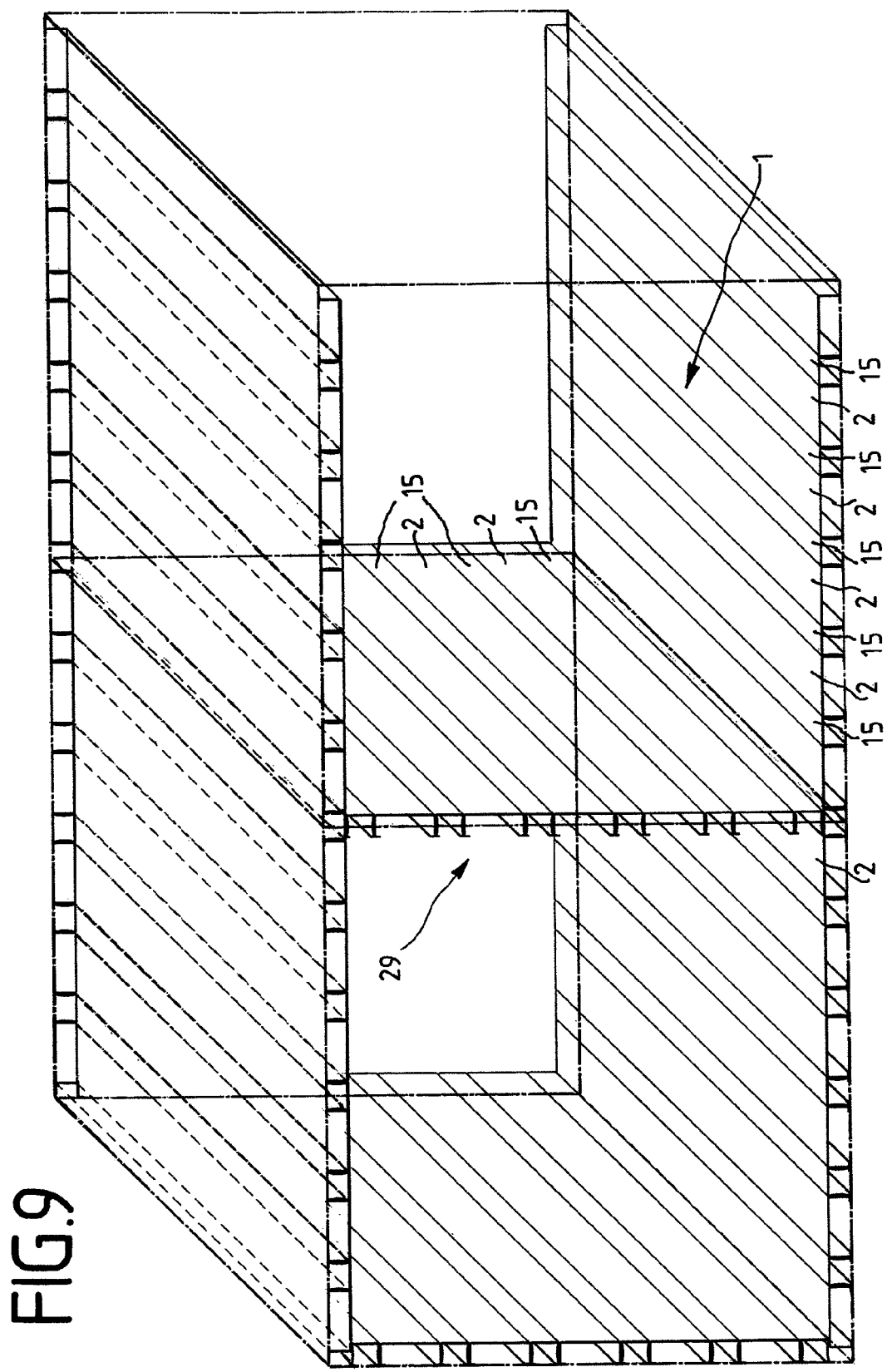

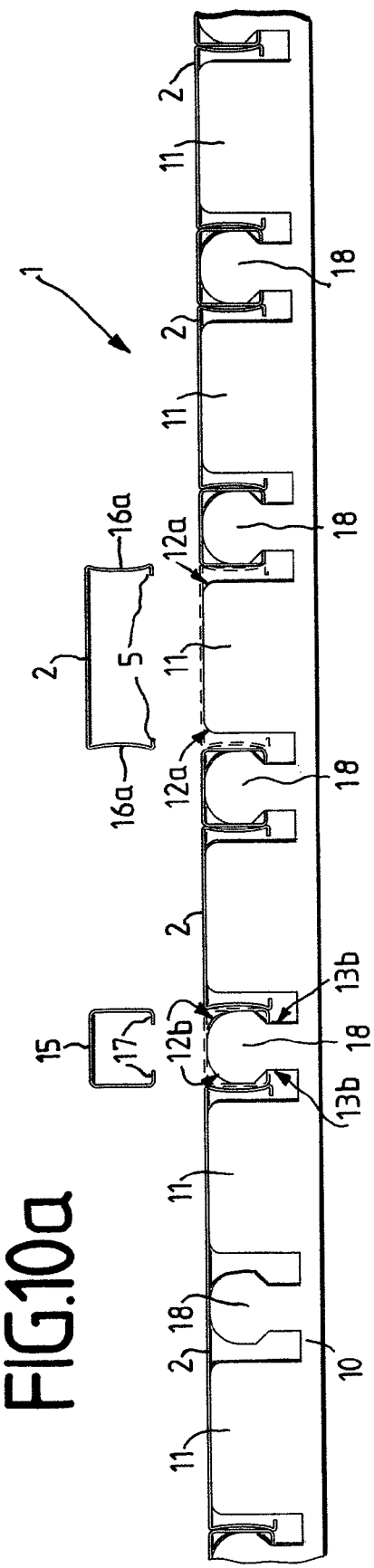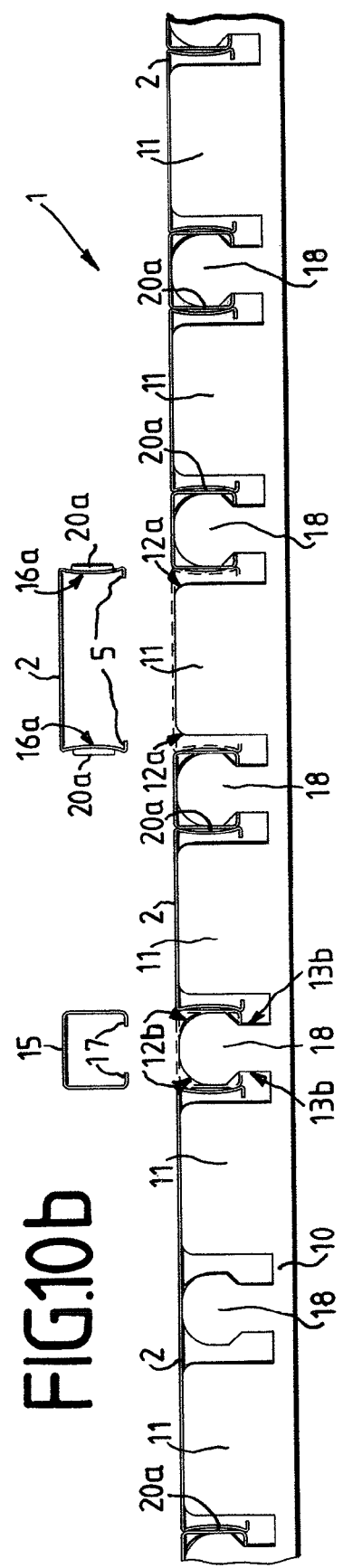

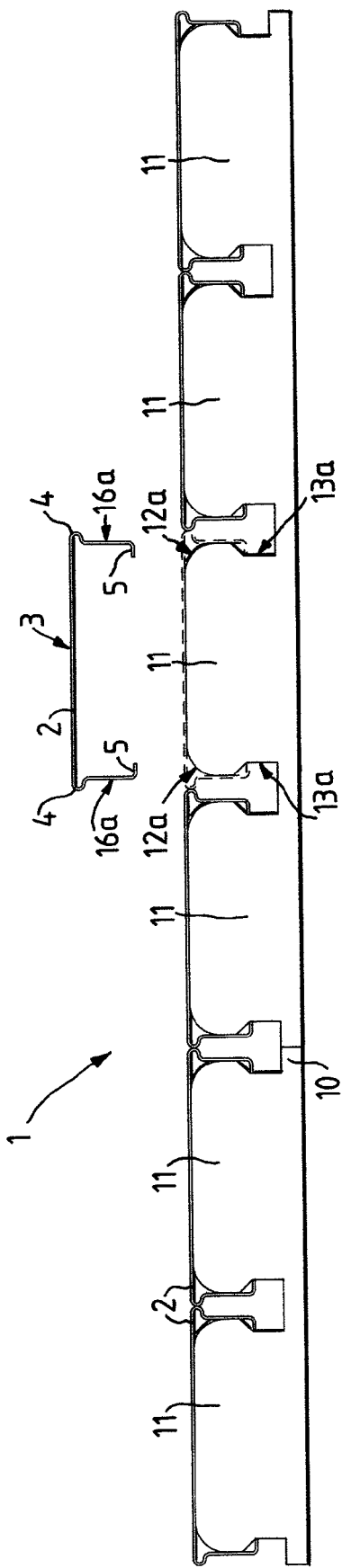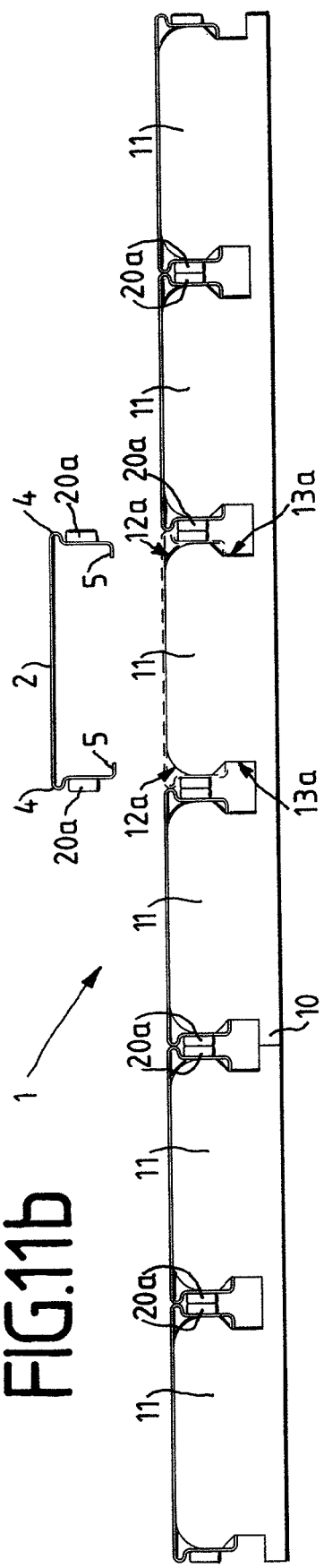

MODULAR HOUSING WALL FOR TELECOMMUNICATIONS DEVICES

TECHNICAL FIELD

The invention relates to a modular housing wall for telecommunications and data technology devices.

BACKGROUND

Various commercially available embodiments of modular housing walls for telecommunications devices are already known from the prior art. For example, DE 19709460 C2 discloses a housing for outdoor use for accommodation of electronics, in particular of telecommunications and data technology components, with the electronics being surrounded in a hermetically sealed form by a first inner housing, and a second outer housing being arranged in the first inner housing in such a way that a cavity is formed between the housings, with the second outer housing being formed by hollow profiled rails which are detachably attached to the first inner housing, and the hollow profiled rails are formed with attachment means, by means of which the hollow profiled rails can be hooked in on the inner housing and are arranged such that they are externally inaccessible when assembled. One disadvantage of this housing wall which is described in the prior art is that the configuration and form of the hollow profiled rails cannot be varied without restrictions. In fact, the hollow profile structure in its own right necessitates a specific external shape of the housing wall. Furthermore, the hollow profiled rails have a quite complex design, for which reason housing walls such as these are not very advantageous as a simple standard embodiment of a housing wall for telecommunications devices, because of their high manufacturing costs. Another disadvantage is the fact that the housing generally cannot be assembled without the use of tools.

SUMMARY

The invention is thus based on the technical problem of providing an improved modular housing wall for telecommunications devices.

In this case, the invention is based on the discovery that the use of standard components and attachment means which can be manufactured easily considerably increases the versatility of a modular housing wall. According to the invention, this is achieved by proposing a modular housing wall for telecommunications and data technology devices, having at least one cover element in order to form a flat wall section and at least one latching rail for fixing the at least one cover element in which the at least one cover element has, at least in places, a U-shaped cross section with a plurality of latching means, and the latching rail has attachment means with notches, with which the latching means engage in order to hook the cover element in on the latching rail. This simple design allows low-cost manufacture both of the cover element and of the latching rail, in virtually any desired range of variants. The modular housing wall according to the invention can then be used in the same way aligned both horizontally and vertically as a wall, base or top surface, or else as a separating wall. The latching rail is in this case the load-bearing element of the modular housing wall system, and, inter alia, holds the cover element by latching. At least one pair of latching rails are preferably attached to at least one housing profile, which is used for support. Depending on the length of the cover elements, further latching rails may be required at specific intervals, for support. The cover element, which by way of example is in the form of a panel, is used as a flat housing wall module and, by virtue of its U-shaped contour, can be moved over the attachment means arranged on the latching rail, and via its latching means can be latched into the notches that are located there. In one preferred embodiment, the cover element has no holes or slots whatsoever, thus considerably simplifying the production of the cover element and making it possible to manufacture it in virtually any desired lengths, since the profile of the cover element can in principle be shaped using an endless process (for example as an extruded profile or by means of a rolling and shaping process, or the like), and then this has to be cut to the desired length for use as a component of the modular housing wall. In this case, the latching rail is preferably in the form of a sheet-metal stamped part. However, it is also feasible for it to be cut from a panel as a plastic part, or to be produced as an injection-molded part. The sizes of the cover element and of the latching rail are governed by the respective purpose. The cover element may be produced either from plastic (for example by extrusion) or else from metal (for example from a strip using the rolling and shaping process).

In one advantageous embodiment, the latching means are in the form of edges which run in the longitudinal direction and are bent inwards. This leads to a particularly simple cover element design, and allows the use of simple and low-cost manufacturing methods while at the same time ensuring that the cover element is firmly seated on the latching rail in the assembled, that is to say latched-in, state.

In a further advantageous embodiment, at least one latching means is in the form of an edge which runs in the longitudinal direction and is curved outwards. In this case, the U-shaped cover element clasps one of the attachment means, at least in places, for assembly, while the edge which is curved outwards preferably latches into a notch in an adjacent attachment means, and engages with it. This ensures that the cover element is fixed in a particularly robust manner on the latching rail, without any negative effect on the manufacturing effort or on the simple design of the modular housing wall.

In a further advantageous embodiment, the attachment means are arranged with a periodically recurring grid spacing on the latching rail. This allows a plurality of cover elements to be hooked in and arranged on the latching rail such that they are flush and abut against one another, in order in this way to form a continuous, planar housing wall surface in a simple manner.

In a further advantageous embodiment, the cover elements have a width in the lateral direction by means of which a plurality of attachment means can in each case be covered, with the latching means of the cover elements engaging with in each case one of the notches in at least two different attachment means. The smallest possible cover element according to the invention latches over only one attachment means on the latching rail. The next-possible size corresponding to this advantageous embodiment then latches over two attachment means, and so on. The largest possible cover element latches over "n" attachment means. The maximum possible width of the cover element is in this case governed in particular by the material which is used, the material thickness and the production method. The assembly grid (module) can in principle be chosen as required, and is governed by the surrounding housing and its physical design, thus allowing virtually unlimited versatility for modular design of the housing wall in a simple manner. The cover elements may be arranged as required by the user or else may be replaced subsequently, since the system is of modular design.

In a further advantageous embodiment, the attachment means are in the form of lugs arranged on the latching rail, with the notches in each case being arranged at the junction between the latching rail and the lugs. In this case, the notches are arranged at that end of the lugs which is not freestanding but is connected to the latching rail, and is opposite a freestanding end of the lugs. For assembly, the U-shaped contour of one of the cover elements is then pushed over one of the lugs, with its latching means in each case engaging in one of the notches at the base of the lug. In this case, the cover element can be clipped, in a preferred manner without the use of tools, onto the latching rail attachment means, which are in the form of lugs, thus considerably simplifying the fitting of the modular housing wall.

In a further advantageous embodiment, the lugs have an at least partially rounded outline at their freestanding end. This enormously simplifies the fitting of the modular housing wall since the fact that the U-shaped cover element has an outline which is rounded at least in places means that it can be pushed particularly easily from above over the attachment means, which are in the form of lugs, so that its latching means can in each case latch into one of the notches at the base of the lugs, in order to form a robust connection.

In a further advantageous embodiment, at least one U-shaped filling profile is provided, and the latching rail has at least one supporting lug, with the filling profile being arranged alongside the at least one cover element on the latching rail and engaging in an interlocking form with the supporting lug for attachment. The filling profile is in this case clamped alongside a cover element, preferably without the use of any tools, and blocks the latter against the relevant attachment means on the latching rail. The filling profile preferably has no holes or slots whatsoever, thus considerably simplifying production and allowing virtually any desired lengths, since the profile can in principle be formed using an endless process, (for example as an extruded profile or using a rolling and shaping process, or the like), and then just has to be cut to the desired length for use as a component of the modular housing wall. In the fitted state, the upper face of the filling profile preferably—but not absolutely necessarily—ends flush with the upper face of the cover element thus resulting in a virtually planar surface, which is interrupted only by any rounded areas which may possibly be provided at the abutment points. Lower bent edges (which point inwards) on the side surfaces of the filling profile preferably in this case clamp the filling profile firmly somewhat below the latching means of the cover element, thus in particular offering increased security against the filling profile becoming inadvertently detached as a result of shaking and vibration. The prestressing which is produced in this way of the side limbs of the U-shaped filling profile prevents it from leaving its correct final position as a result of vibration or shaking. Furthermore, the filling profile blocks the respectively adjacent cover element from becoming unlocked, and also increases the contact pressure between the cover element and the latching rail. The linear contact surfaces between the filling profile and the adjacent cover element ensure at least a simple sealing effect against dust and water splashes, as well as electrical ground contact if the surface is electrically conductive. The filling profile can then likewise preferably be removed without the use of tools, particularly when the design of the housing allows the filling profile to be pushed out of its interlocking engagement with the supporting lug from underneath using a finger. It is advisable, if required, to use a simple object in the form of a hook (for example a robust, bent paperclip) as an aid, for example, and to lift the filling profile from its upper face on one side somewhat, so that it can then be gripped.

In a further advantageous embodiment, the filling profile has a plurality of latching means and the at least one supporting lug has notches at its junction with the latching rail, and/or has an outline which is rounded at least in places at its freestanding end. For fitting purposes, the U-shaped contour of the filling profile allows it to be pushed over the supporting lug, and for its latching means to be latched into in each case one of the notches at the base of the support lug. The filling profile is preferably in this case "clipped onto" supporting lugs on the latching rail without the use of tools, thus considerably simplifying the assembly of the modular housing wall. The outline of the supporting lugs, which is rounded at least in places, at its freestanding end in this case makes it enormously easier to fit the modular housing wall since this rounded outline means that the U-shaped filling profile can be pushed over the supporting lug particularly easily from above, in order to allow its latching means to latch into in each case one of the notches—if present—at the base of the supporting lugs in order to form a robust connection, and to firmly clamp the filling profile on the supporting lug by virtue of its prestressing.

In a further advantageous embodiment, a filling profile is in each case arranged between two cover elements. In this case, the latching rail has attachment means for holding the cover elements, and has supporting lugs in between them, in order to support the filling profiles. These contours alternate on the latching rail with an installation grid (module) which can be determined virtually without any restriction. The installation grid is governed only by the surrounding housing and its physical design. The module, which comprises an integer number, is in this case formed from the width of the smallest cover element plus the width of one filling profile. This results, for example, for a fictional module "1" (on the assumption of a few examples of numerical values for the cover element and for the filling profile) in the following width: Module "1"=1 ×cover element "1"+1 ×filling profile=235 mm+15 mm=250 mm.

The calculation for larger cover elements is analogous, with the module always having an integer number. Thus, for example, the width for the fictional module "5" is as follows:

Module "5"=1 ×cover element "5"+1 ×filling profile=235 mm+15 mm=250 mm.

As can be seen from this, the quoted example is based on a chosen module with an installation grid of 50 mm, in which case the filling profile always has a constant width of, for example, 15 mm. The module is thus the governing factor for the position of the attachment elements for fixing of the cover element and of the supporting lugs for fixing of the filling profiles on the latching rail. For installation, the filling profile is then pushed, with a slight pressure but without the use of any tools, between two cover elements until it makes contact with the supporting lugs on the supporting rail. If one filling profile is in each case arranged between two cover elements, then the cover elements can likewise be removed without the use of any tools by removing the two adjacent filling profiles in advance and then unlocking the cover elements via the attachment element, for example using the fingers. On the other hand, it is also sufficient to make use of a simple object in the form of a hook, and to lift the filling profile from its upper face on one side somewhat in order then to allow it to be gripped. This is particularly advantageous when cover elements are fitted retrospectively, for example when a cover element in the form of a blank panel is intended to be replaced by a panel which, for example, has cable bushings. This can be done quickly and directly by the user at his own premises, without having to move the other parts of the modular housing wall. Fittings do not prevent this process either, provided that a minimum separation is maintained between the cover element and the fittings.

In a further advantageous embodiment, at least the surface of the modular housing wall has electrically conductive characteristics. This offers the advantage that the modular housing wall can also be used for applications with particular requirements for electromagnetic compatibility (EMC), since parts which are intended to provide EMC protection must be electrically conductive (for example composed of metal) and/or must at least have a conductive coating. For example, in the case of cable junctions or electrical switching cabinets, it is frequently necessary to comply with additional requirements for electromagnetic compatibility (EMC). Thus, in the case of housing walls which, for example, are used for a switching cabinet in the telecommunications field, it is generally necessary to provide them with EMC protection, that is to say EMC-compatible shielding, which prevents, for example, interference signals caused by switching processes in the switching cabinet being able to pass out of the switching cabinet through the housing wall.

In a further advantageous embodiment, at least one seal is in each case provided in the intermediate spaces between at least two of the cover elements, and/or between the at least one cover element and at least one housing profile, and/or between the at least one cover element and the at least one filling profile and/or between the at least one filling profile and the at least one housing profile. The seal in this case improves, in particular, the sealing of the modular housing wall against the ingress of water forced in from the outside or against the ingress of moisture, as a result of which the modular housing wall is then particularly suitable for outdoor applications, that is to say in the open air.

In a further advantageous embodiment, the seal has an inner core composed of an elastic material whose circumference is sheathed by a conductive fabric. A seal such as this not only improves the sealing of the modular housing wall against the pressure of water or against the ingress of moisture, but is also used to comply with additional requirements relating to electromagnetic compatibility (EMC) of the modular housing, that is to say the seal is at the same time also EMC-proof in the frequency range specified for this seal. This embodiment is accordingly particularly suitable for EMC-proof applications in the outdoor area. The inner core is in this case preferably composed of a soft elastomer core, for example foam, neoprene, silicone, PVC, ethylene-propylene elastomer (EPDM) or some other plastic with elastic characteristics. When used between two cover elements, it has in this case been found to be preferable to have a quadrilateral cross section, and furthermore preferably a rectangular cross section. However, it is also feasible for the inner core to be an elastomer which is filled with metal or carbon, and is thus electrically conductive. The conductive fabric is preferably in the form of a metal mesh. However, it is also feasible for the fabric structure to have metal-coated threads, for example silver-plated nylon threads.

In a further advantageous embodiment, the side limbs of the U-shaped cross section of the at least one filling profile and/or of the at least one cover element are concave. Although the outer edges of the filling profile (which make contact with a cover element located alongside it) in their own right provide a simple sealing effect, the concave side surfaces furthermore act as a free space for holding additional seals, if this is necessary in specific situations.

In a further advantageous embodiment, the side limbs of the U-shaped cover element and/or of the U-shaped filling profile are transversely slotted with a periodically recurring grid spacing in the longitudinal direction in order to produce shielding spring elements. The shortened linear, interlocking contact surfaces of the cover elements produced in this way against the adjacent filling profiles and/or against one another result in improved protection against the ingress of dust or water splashes, as well as providing an electrical ground contact if the surface is conductive.

In another advantageous embodiment, the width of the shielding spring elements in the longitudinal direction and the gap length of the slots is in each case $\lambda/10$ of the highest frequency to be shielded against. In this case, $\lambda$ corresponds to the wavelength of the electromagnetic waves to be shielded against. The individual shielding spring elements which are produced by means of the slots and make contact with the adjacent cover elements result in improved EMC protection. The width of the individual shielding spring elements is governed by the frequency range to be shielded against and by the upper attenuation level, in which case the width should preferably be less than $\lambda/10$ of the highest frequency.

In a further advantageous embodiment, the at least one cover element and/or the at least one filling profile has at least one area which is perforated at regular intervals. The modular housing wall formed in this way is thus also suitable, for example, for use as an air-permeable separating wall, as is often required, for example, in ventilated and air-conditioned housings or cabinets, in which, by way of example, separate access or entry rights must be provided. The cover element and/or the filling profile may be perforated with any desired hole pattern for this purpose.

In a further advantageous embodiment, the at least one cover element and/or the at least one filling profile is formed at least in places from a wire mesh. This embodiment also allows the use of the modular housing wall as an air-permeable separating wall.

In a further advantageous embodiment, the at least one cover element and/or the at least one filling profile has openings for holding cable bushings. In conjunction with closed cover elements and/or filling profiles, this allows virtually any desired combinations of user-specific housing walls to be produced easily and at low cost and to be used, for example, as wall, base or top claddings or separating walls. The openings are in this case used for holding and fixing a cable bushing, and for a cable to be passed through the modular housing wall in this way. In this case, it is also feasible for the cable bushing that is used for this purpose at the same time to have electrically conductive characteristics thus allowing it to be used as an EMC-proof shield in its own right without the need to fit any additional shielding elements. This may be done, for example, by introducing an electrically conductive additional material into the elastic basic material of the cable bushing, thus providing the cable bushing with electrically conductive characteristics. In this case, at least the edge of the opening in the modular housing wall, that is to say in the cover element and/or in the filling profile, is preferably metallic, and the cable bushing then engages with it preferably directly and without any further aids or accessories. It is also feasible for the user himself to be able, when required, to move individual closed cover elements and/or filling profiles from the modular housing wall in order subsequently to introduce openings, that is to say for example apertures for holding cable bushings, in accordance with the individual requirements, as is possible in most cases quite easily using conventional drilling or stamping tools. This means that there is then no need to define the shape and diameter of the aperture in the modular housing wall in which a specific cable bushing is intended to be positioned during the actual production process of the modular housing wall. In fact, this can be left until during or after in-situ installation, thus considerably improving the flexibility for use of the modular housing wall. Furthermore, the aperture for the cable bushing may have virtually any desired shape.

BRIEF DESCRIPTION OF THE DRAWINGS

The invention will be explained in more detail in the following text with reference to one preferred exemplary embodiment. In the associated drawings:

FIGS. 6a, 6b show a schematic illustration of options for connection of the modular housing wall to a housing profile, in each case showing two different variants, FIGS. 7a, 7b show a schematic illustration of the end connection of the modular housing wall to a housing profile, in each case showing two different variants, FIGS. 8a, 8b show a schematic illustration of the cross section of a housing with a modular housing wall, showing two different variants, FIG. 9 shows a schematic illustration of a perspective cross-sectional view of a housing with two different variants of a modular housing wall, FIGS. 10a, 10b show a schematic illustration of the cross-sectional view of a further preferred embodiment of a modular housing wall, and FIGS. 11a, 11b show a schematic illustration of the cross-sectional view of a further embodiment of a modular housing wall.

DETAILED DESCRIPTION

Figure 1:
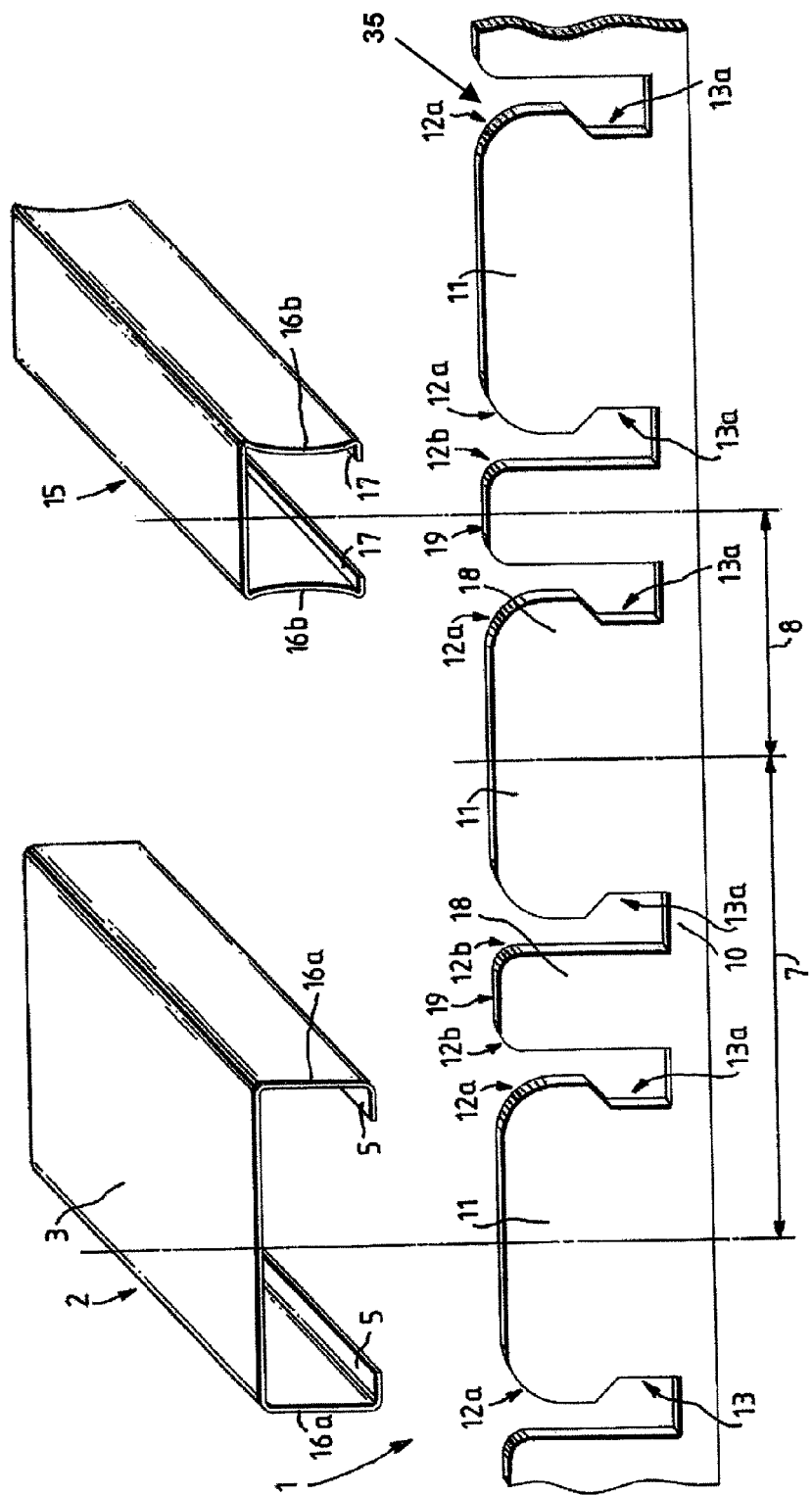
FIG. 1 shows a schematic illustration of a perspective side view of the basic elements of a modular housing wall.

FIG. 1 shows, schematically, a perspective side view of the basic elements of a modular housing wall 1. The illustration in this case shows, separately from one another, that is to say in the unassembled state, a cover element 2 for forming a flat wall section, a filling profile 15 and a latching rail 10 for fixing the cover element 2 and the filling profile 15. In some places, the cover element 2 has a U-shaped cross section with a plurality of latching means 5 which are in the form of edges which run in the longitudinal direction and are bent inwards. In this case, bent edges of the cover element 2, which are bent at right angles to its base surface 3, form the side limbs 16a of its U-shaped cross-sectional profile. The latching rail 10 has attachment means 35, which are in the form of lugs 11 and have notches 13a, with which the latching means 5 can engage in order to hook the cover element 2 in on the latching rail 10. The notches 13a are in each case arranged at the junction between the latching rail 10 and the lugs 11. At their freestanding end, the lugs 11 have an outline 12a which is rounded at least in places. The latching rail 10 also has supporting lugs 18, with which the filling profile 15 can engage for attachment, in an interlocking manner and preferably in a force-fitting manner, and can be arranged on the latching rail 10. At their freestanding end 19, the supporting lugs 18 have an outline 12b which is rounded in places. The cover element 2, which is in the form of a panel, is used as a flat housing wall module and, by virtue of its U-shaped contour, can be pushed over the lugs 11 which are arranged on the latching rail 10, with its latching means 5 latching in the notches 13a that are located there. The filling profile 15 has lower bent edges 17 which point inwards on its side surfaces 16b, thus making it possible to produce a clamping effect on the supporting lugs 18. The lugs 11 as well as the supporting lugs 18 are arranged with a periodically recurring grid spacing on the latching rail 10. In this case, a supporting lug 18 for supporting the filling profiles 15 is in each case arranged between two lugs 11 for holding the cover elements 2. These contours alternate in an installation grid which can be defined virtually as required, the so-called module 7, on the latching rail 10. The module 7 of the modular housing wall 1 governs the position of the lugs 11 for attachment of the cover element 2 and of the supporting lugs 18 for attachment of the filling profiles 15 on the latching rail 10. The module 7 in this case corresponds to the distance between centers of two adjacent lugs 11. The distance between centers between one of the lugs 11 and the respective adjacent supporting lug 18 in this case corresponds to half the module 8.

Figure 2:
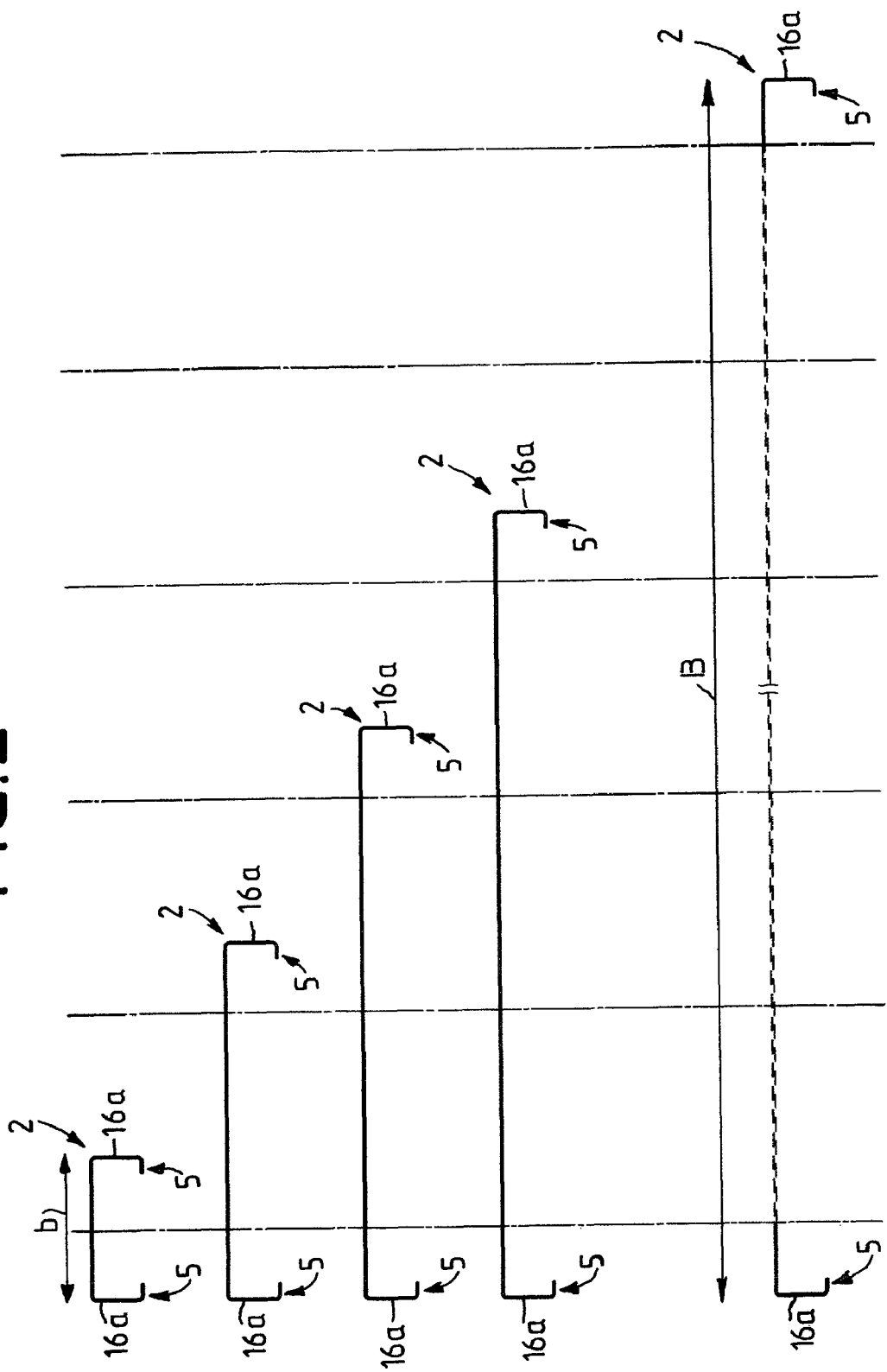
FIG. 2 shows a schematic illustration of the cross-sectional views of different cover elements.

FIG. 2 shows, schematically, the cross-sectional view of cover elements 2 of different width, which correspond to the various panel sizes. The sizes of the latching means 5 and of the side limbs 16a of the individual cover elements 2 do not, however, differ in this case. The cover elements 2 have a width B in their lateral direction, by means of which either only one of the lugs 11 or in each case a plurality of lugs 11 on the latching rail 10 (see FIG. 1) can be covered, wherein, in the latter case—that is to say for a cover element of the size order (n>1) which covers a plurality of lugs 11—the latching means 5 for the cover element 2 can engage with in each case one of the notches 13a in two different lugs 11. The smallest possible cover element 2 latches over only one lug 11 on the latching rail 10 and its size order is thus "1". The next-possible size then latches over two lugs 11 and its size order is thus "2", etc. The largest possible cover element 2 latches over "n" lugs 11. If b corresponds to the width of the smallest cover element 2 of size order "1", then the width B of the cover element 2 which can be latched over "n" lugs 11 is as follows:

$$B=(n-1)\times\text{module}+b$$

Thus, for example for a cover element 2 of size order n=5 and module=50 mm and a smallest cover element 2 with a width b=35 mm:

$$B=(5-1)\times 50\text{ mm}+35\text{ mm}=200\text{ mm}+35\text{ mm}=235\text{ mm}$$

The maximum possible width B of the cover element 2 is in this case governed in particular by the material which is used, the material thickness and the production method. The installation grid (that is to say the module 7) can in principle by chosen as required and is governed by the surrounding housing and by its physical design. The cover elements 2 can be arranged as required by the user, and can also be replaced subsequently, owing to the modular design of the system. If a filling profile 15 is in each case arranged between two cover elements 2 (see FIG. 1), then the module 7 is composed of the width b of the smallest cover element 2 plus the width $B_F$ of one filling profile. This thus results in the module 7 with the following width, for example, for a smallest cover element 2 with a width b=35 mm and a filling profile with the width $B_F$=15 mm:

$$\text{Module}=b+B_F=35\text{ mm}+15\text{ mm}=50\text{ mm}$$

The calculation for larger cover elements 2 is analogous, with the size order of the cover elements 2 always being an integer. As can be seen from this, the chosen module 7 in the exemplary embodiment is based on an installation grid of 50 mm, with the filling profile 15 in this case always having a constant width $B_F$ of, for example, 15 mm.

Figure 3:
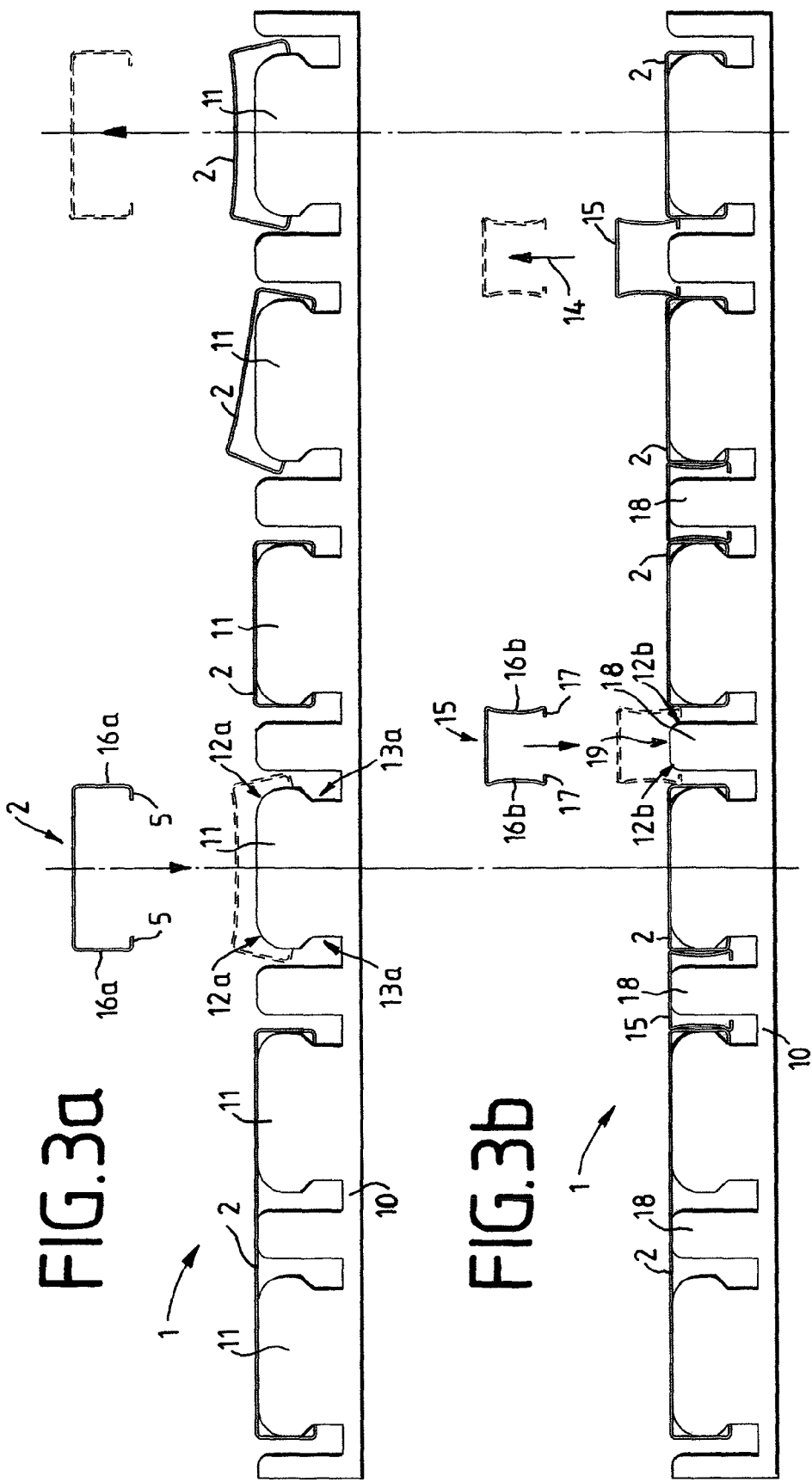
FIGS. 3a, 3b show a schematic illustration of the installation and removal processes for a modular housing wall.

FIGS. 3a and 3b show the process of fitting and removing a modular housing wall 1, schematically. The latching rail 10 is in this case the load-bearing element of the modular housing wall system and holds the cover element 2 by means of latching in, as well as the filling profile 15. As can be seen, the cover element 2 (which is in the form of a panel) is used as a flat housing wall module, can be pushed by virtue of its U-shaped contour over the lugs 11 which are arranged on the latching rail 10, and latches in without any play by means of its latching means 5, which are in the form of edges which run in the longitudinal direction of the cover element 2 and are bent inwards, in the notches 13a that are located there (see FIG. 3a). In order to simplify the assembly process, the lugs 11 have an outline 12a which is rounded at least in places at their freestanding end. The installation process for the filling profile 15 is carried out in a similar manner (see FIG. 3b). For installation, the filling profile 15 is pushed with small amounts of pressure, preferably without the means of any tools, between two of the cover elements 2 until it makes contact with one of the supporting lugs 18 on the latching rail 10. In consequence, the filling profile 15 is clamped between the two cover elements 2, and blocks them against the relevant lug 11 on the latching rail 10. The latching rail 10 in this case has the supporting lugs 18 for attachment of the filling profile 15, with the filling profile 15 then being arranged alongside in each case one cover element 2 on the latching rail 10 once the installation process has been completed, engaging in an interlocking manner with the supporting lug 18 for attachment, and preferably additionally being fixed with a force fit by being squeezed. The supporting lugs 18 have the outline 12b, which is rounded in places, at their freestanding end 19 in order to simplify the assembly process. This rounded outline means that the U-shaped contour of the filling profile 15 can be pushed over the supporting lug 18 particularly easily from above, for assembly. In this case, the filling profile 15 is preferably "clipped" onto the supporting lug 18, without the use of any tools, in order then to be clamped firmly by its prestressing on the supporting lug 18, in order to form a robust connection. The upper face of the filling profile 15 then preferably ends flush with the upper face of the cover elements 2, resulting in a virtually flat surface, interrupted only by rounded areas at the abutment points. The lower bent edges 17, which point inwards, of the side surfaces 16b of the filling profile 15 in this case firmly clamp the filling profile 15 somewhat below the latching means 5 of the cover element 2, thus in particular offering increased security against inadvertent detachment of the filling profile 15 in the event of shaking and vibration. The prestressing of the side limbs 16b of the U-shaped filling profile 15 that is produced in this case prevents it from leaving its correct final position as a result of vibration or shaking. Attachment of the filling profile 15 to the supporting lug 18 is thus preferably in addition to the interlocking fixing which is produced by virtue of its U-shaped cross section, additionally as a force fit in particular in the direction indicated by the arrows 14. Furthermore, the filling profile 15 blocks the respectively adjacent cover element 2 against unlocking. The filling profile 15 is then likewise removed in a preferred manner, without the use of any tools. The lugs 11 and the supporting lugs 18 are in each case arranged with a periodically recurring grid spacing on the latching rail 10. One filling profile 15 is preferably in each case arranged between two cover elements 2. If one filling profile 15 is in each case located between two cover elements 2 in the assembled state, then the cover elements 2 can likewise be removed without the use of any tools by removing the two adjacent filling profiles 15 in advance and then unlocking the cover element 2 via the lug 11, for example using the fingers. For this purpose, provided that they are fully accessible from underneath, the adjacent filling profiles 15 are pushed in the direction of the arrow 14 with a slight pressure between the two respective adjacent cover elements 2, without the use of any tools, and are removed. Otherwise, it is sufficient to make use of a simple object in the form of a hook and to raise the filling profile 15 somewhat on one side from its upper face, so that it can then be gripped. After removal of the two adjacent filling profiles 15, the cover element 2 is then removed first of all by unlocking it at one end on one side, and then on the other side via the lug 11, by finger pressure from underneath. The same procedure is used on any other latching rails at the other end of the modular housing wall 1. The cover element 2 can then be taken away. If the cover element is not freely accessible from underneath, then a simple object in the form of a hook can likewise also be used as an aid for this purpose, with the cover element 2 being unlatched from above point-by-point, so that it can then be gripped.

Figure 4:
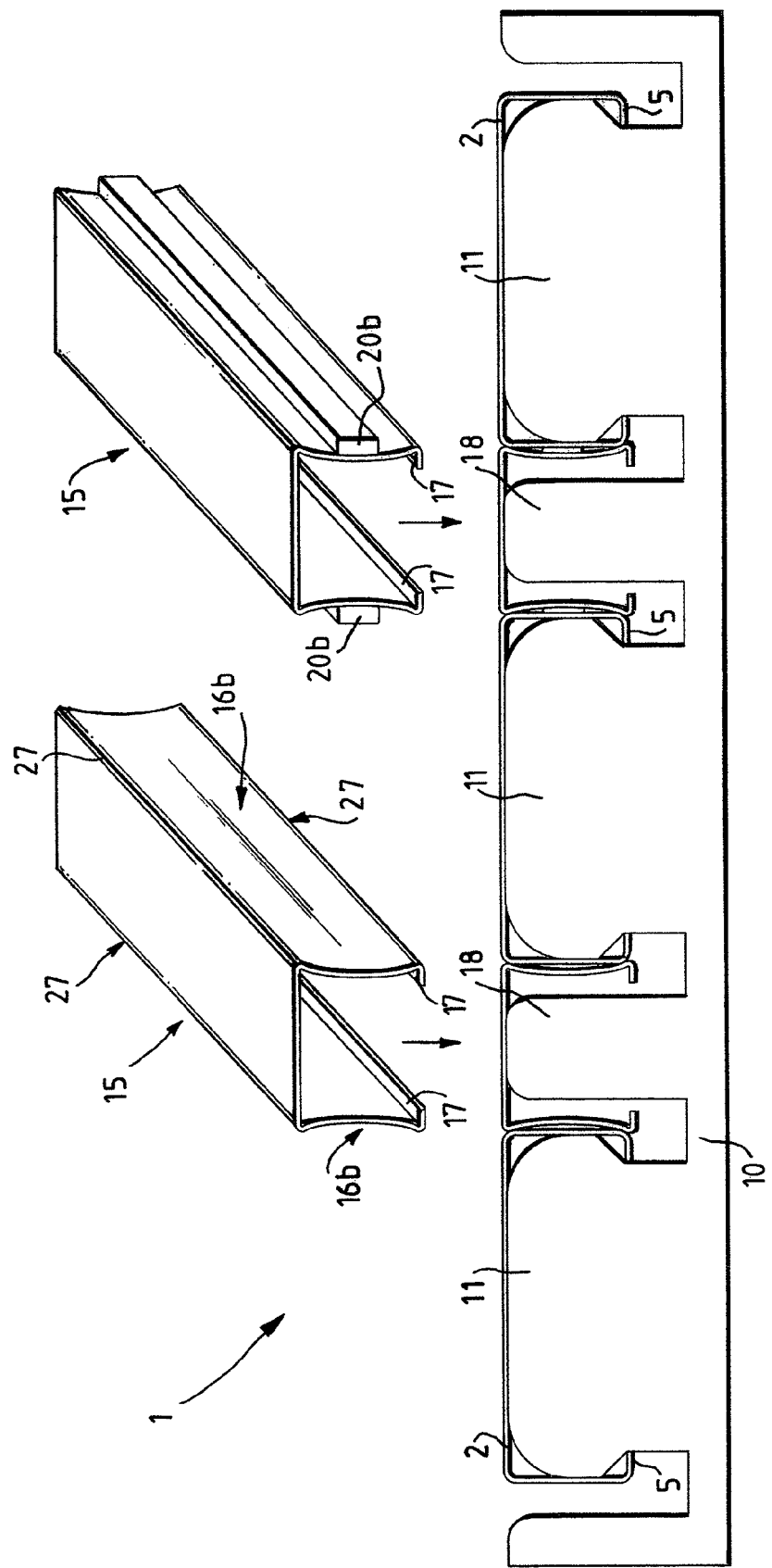
FIG. 4 shows a schematic illustration of one preferred embodiment of the modular housing wall with two different variants of a filling profile.

FIG. 4 shows, schematically, one preferred embodiment of the modular housing wall 1 with two different variants of a filling profile 15. In this case, the first variant shows a filling profile 15 without any further sealing elements, in the unassembled state and in the assembled state. The four linear, interlocking contact surfaces 27, which make contact with the two adjacent cover elements 2 at least in places, in their own right provide simple protection against the ingress of dust and water splashes. The filling profile 15 in this case on the one hand protects the respectively adjacent cover element 2 against unlocking and, furthermore, increases the contact pressure between the cover element 2 and the latching rail 10. In addition, the surface of the modular housing wall 1, that is to say at least of the cover elements 2, of the filling profiles 15 and of the latching rail 10, preferably has electrically conductive characteristics. In principle, the modular housing wall 1 could thus also be used for EMC-proof applications. However, a contact between the contact surfaces 27 and the cover elements 2 is generally not sufficient for EMC protection purposes on its own, since the free gap lengths which may possibly occur in some cases here cannot be regarded as being EMC-proof. Furthermore, the side limbs 16b of the U-shaped cross section of the filling profile 15 are concave. Admittedly, the outer edges of the filling profile 15, which are in the form of linear contact surfaces 27 and make contact with the respective cover element 2 alongside them, provide a simple sealing effect in their own right, but the concave side surfaces are also used as a free space for holding additional seals. Thus, in the second variant of this embodiment, a seal 20b is in each case provided in intermediate spaces between the cover elements 2 and the filling profile 15. The seal 20b in this case improves the sealing of the modular housing wall 1 against water being forced inwards from the outside, or against the ingress of moisture. The seals 20b are in this case preferably designed to be self-adhesive, and are fitted on both sides of the filling profile 15 to the outside of its side limbs 16b.

Figure 5:
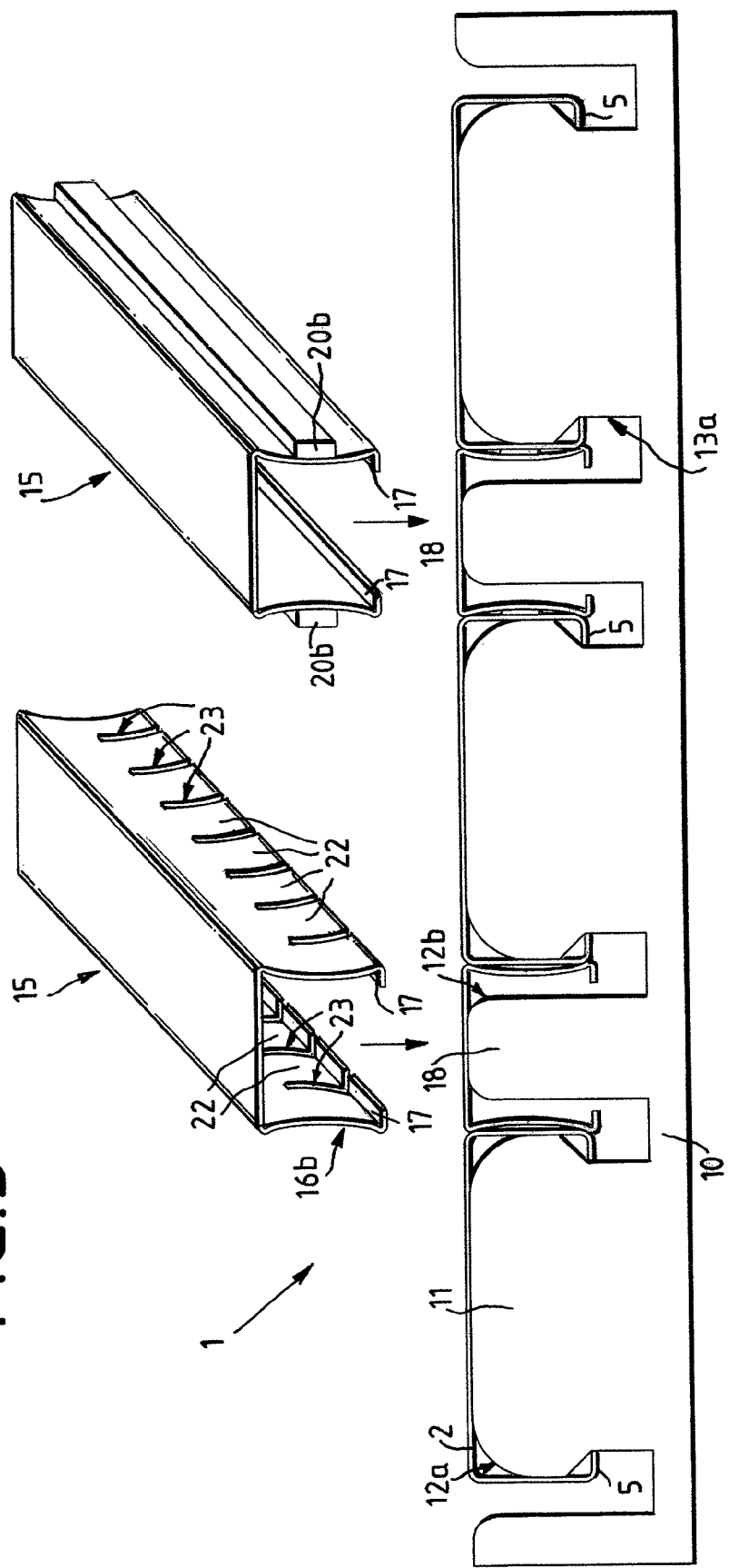
FIG. 5 shows a schematic illustration of a further preferred embodiment of an EMC-proof variant of a modular housing wall.

FIG. 5 shows, schematically, a further preferred embodiment of a modular housing wall, in particular of an EMC-proof variant. In this case, the first variant shows a filling profile 15 without further sealing elements in the uninstalled state and in the installed state. The surface of the modular housing wall 1, that is to say at least of the cover elements 2, of the filling profiles 15 and of the latching rail 10, preferably has electrically conductive characteristics. Furthermore, the side limbs 16b of the U-shaped filling profile 15 are slotted laterally in the form of slots 23 with a periodically recurring grid spacing in the longitudinal direction in order to produce shielding spring elements 22. The shortened, linear interlocking contact surfaces of the cover elements 2 produced in this way against the adjacent filling profiles 15 result in improved protection against the ingress of dust or water splashes, as well as an electrical ground contact if the surface is electrically conductive. The width of the shielding spring elements 22 in the longitudinal direction and the gap length of the slots 23 are each preferably $\lambda/10$ of the highest frequency to be shielded against. In this case, $\lambda$ corresponds to the wavelength of the electromagnetic waves to be shielded against. The individual shielding spring elements 22 which are produced by means of the slots 23 and make contact with the adjacent cover elements 2 preferably result in improved EMC protection. The width of the individual shielding spring elements 22 is then governed by the frequency range to be shielded against and by the upper attenuation level, with the width preferably having to be less than $\lambda/10$ of the highest frequency. In this case as well, the side limbs 16b of the U-shaped cross section of the filling profile 15 are concave. In the second variant of an EMC-proof embodiment of the modular housing wall 1, one of the seals 20b is once again provided in each case in intermediate spaces between the cover elements 2 and the filling profile 15. However, the seals 20b also have an inner core composed of a soft elastomer, preferably neoprene, whose circumference is sheathed with a conductive fabric structure, preferably a metal textile, and has a rectangular cross section. The seal 20b is thus also used to satisfy additional requirements relating to the electromagnetic compatibility (EMC) of the modular housing, that is to say the seal 20b is at the same time also EMC-proof in the frequency range specified for this seal 20b. The seals 20b are in this case preferably self-adhesive, and are fitted on both sides to the outsides of the side limbs 16b of the filling profile 15.

Figure 6B:
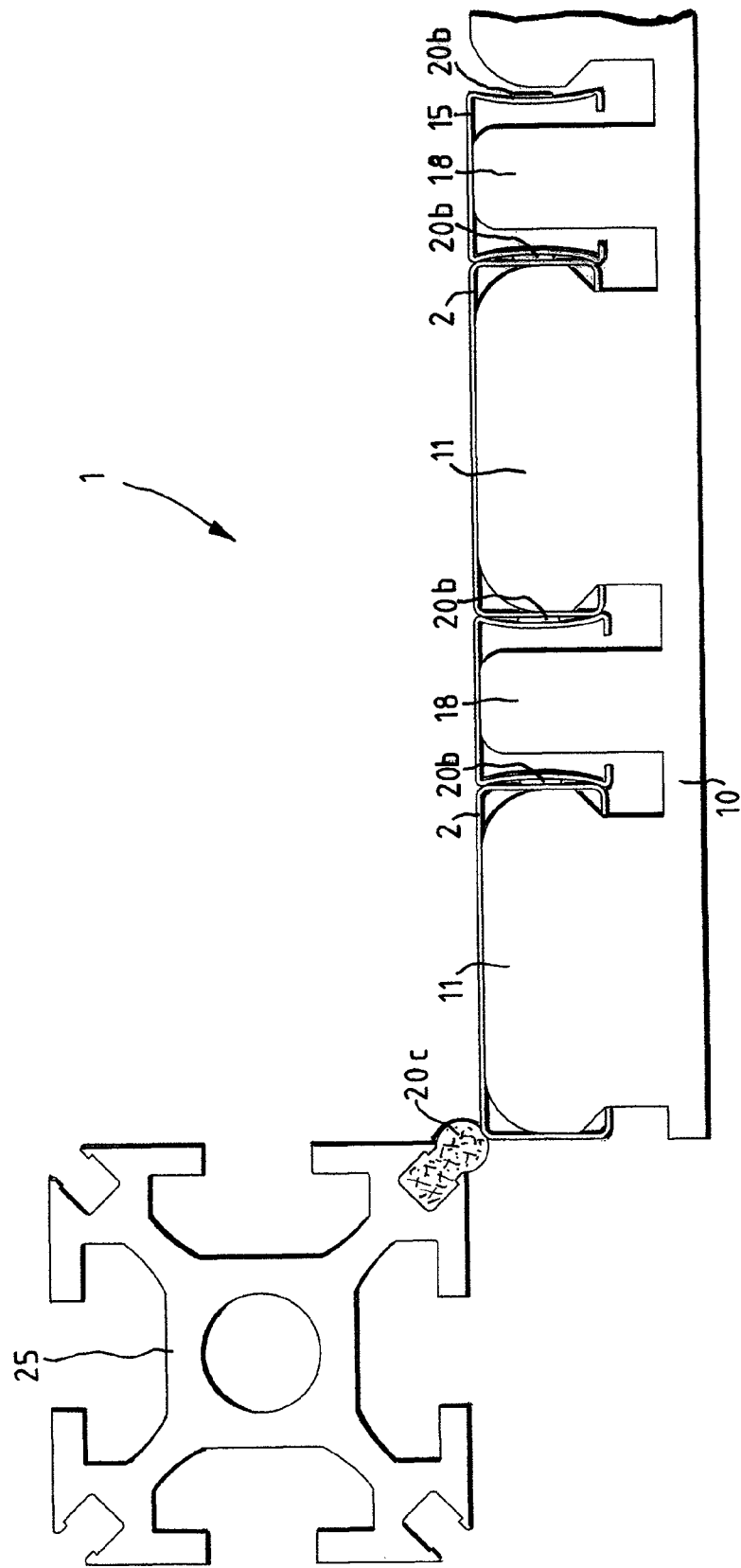

FIGS. 6a and 6b show, schematically, options for the connection of the modular housing wall 1 to a housing profile 25, in two different variants in each case. FIG. 6a in this case shows one simple sealing option on an initial piece or end piece of the modular housing wall 1 against the housing to be sealed. In the illustrated embodiment, a filling profile 15 provides sealing against the housing profile 25 which, for example, is in the form of an extruded aluminum profile. The simple sealing effect is achieved by the shaping and the contact pressure of the filling profile 15, which is pressed against the supporting lug 18, against the housing profile 25. The two linear, interlocking contact surfaces 27 against the housing result in their own right in simple protection against the ingress of dust or water splashes, as well as an electrical ground contact if the surface is conductive. However, this contact is not sufficient EMC protection since, in this case, the free gap lengths which may possibly occur in places cannot in this case be regarded as being EMC-proof. FIG. 6b shows an improved sealing option on the initial piece or end piece of the modular housing wall 1, which has latched-on cover elements 2 and filling profiles 15, against the housing to be sealed. In this case, for example, the cover element 2 which is latched onto the lug 11 provide sealing against an elastic seal 20c, which is introduced into a corner groove in the housing profile 25 which, for example, is in the form of an extruded aluminum profile. In comparison to FIG. 6a, this seal 20c improves the sealing against water being forced in from the outside or against the ingress of moisture. However, seal 20c also preferably has an inner core composed of a soft elastomer, preferably neoprene, whose circumference is sheathed by a conductive fabric structure, preferably a metal textile. The seal 20b is thus also at the same time EMC-proof in the frequency range specified for this seal 20b, thus resulting in EMC protection for the modular housing wall 1 when the surface is electrically conductive, in conjunction with the housing profile 25 as well.

FIGS. 7a and 7b show, schematically, the end connection of the modular housing wall 1 to the housing profile 25, in each case in two different variants. FIG. 7a shows the end termination of the cover elements 2 and of the filling profiles 15 against the housing profile 25 without any additional sealing elements. Owing to production tolerances, it is scarcely possible to achieve simple sealing against dust or moisture in this way, at most protection against relatively small foreign bodies, such as screws, washers, pieces of wire etc. This use is thus primarily suited for the indoor field, with a low degree of ingress protection. In contrast, FIG. 7b shows an end sealing option for the cover element 2 and for the filling profile 15 against the housing profile 25, in which, in this case, an elastic seal 20c is introduced in a corner groove in the housing profile 25 which, for example, is in the form of an extruded aluminum profile. This seals the end edges of the cover element 2 and of the filling profile 15 against dust and moisture, and is thus also suitable for the outdoor area. The seal 20c is in this case preferably designed to be electrically conductive, for example by sheathing an elastic inner core with a metal textile, and thus at the same time also represents EMC protection.

FIGS. 8a and 8b show, schematically, the cross section of in each case one housing with a modular housing wall 1, in two different variants. FIG. 8a shows an example of a housing cross section in the form of a plan view, illustrating a completely closed modular housing wall 1 composed of cover elements 2 of various size, and of a plurality of filling profiles 15. As can be seen, the cover elements 2 can be arranged in accordance with the user's requirements and can also be replaced subsequently, since the system is of modular design. FIG. 8b shows a further example of a housing cross section in the form of a plan view with a completely closed modular housing wall 1, which has cover elements 2 of different size as well as a plurality of filling profiles 15. In this case, the cover elements 2 and the filling profiles 15 have various openings 30. Each of the openings 30 is in this case used to hold and fix a cable bushing, as well as a cable to be passed through the modular housing wall 1 in this way.

FIG. 9 shows, schematically, a perspective cross-sectional view of a housing with two different variants of a modular housing wall 1. In this case the figure shows, schematically, a three-dimensional structure, for example a vessel, a housing, a cabinet, a container, a cubicle, a room etc., which has at least one floor, one ceiling, side walls and an air-permeable separating wall 29. This is preferably a housing for telecommunications devices, for example a switching cabinet. As can be seen from the figure, the modular housing wall 1 according to the invention can also be used for wall, floor and ceiling surfaces in the same way—closed or provided with apertures. It is also possible to produce separating walls, aligned horizontally or vertically, in a simple manner. The cover elements 2 which are used in the air-permeable separating wall 29 in this case have an area which is perforated at regular intervals. The cover elements 2 may for this purpose be perforated with any desired hole pattern. Furthermore, it is also feasible for at least some of the cover elements 2 in the air-permeable separating wall 29 to be formed from a wire mesh.

FIGS. 10a and 10b show, schematically, the cross-sectional view of a further preferred embodiment of a modular housing wall 1. In the illustrated variant, the latching principles has been reversed, that is to say the supporting lugs 18 have notches 13b with which the bent edges 17 can engage in order to hook the filling profiles 15 in on the latching rail 10. The notches 13b are in this case each arranged at the junction between the latching rail 10 and the supporting lugs 18. The supporting lugs 18 have an outline 12b which is rounded at least in places at their freestanding end. The lugs 11 which are also located on the latching rail 10 and with which the cover element 2 can engage both in an interlocking manner and in a force-fitting manner for attachment and can be arranged on the latching rail 10, have no notches, in contrast to this. The lugs 11, however, likewise have an outline 12a which is rounded in places at their freestanding end. In this case, the filling profiles 15 are first of all latched onto the supporting lugs 18 on the latching rail 10 for installation of the modular housing wall 1. Only after this has been done are the cover elements 2 pushed over the lugs 11 on the latching rail, as a result of which they are supported and are held in their final position. One advantage of this embodiment is that the cover elements 2 can be removed and replaced without having to remove the adjacent filling profiles 15 in advance. The already described sealing and function principles may be used analogously in this embodiment. FIG. 10b illustrates the embodiment shown in FIG. 10a as a variant with additional seals 20a between the cover elements 2 and the filling profiles 15, which thus offer a higher degree of ingress protection against dust and moisture and, if required, with an electrically conductive embodiment offering additional EMC protection. In this case, the seals 20a are preferably arranged in the concave side limbs 16a of the cover element 2 instead of on the filling profile 15—as preferred in the already described variants.

FIGS. 11a and 11b show, schematically, the cross-sectional view of a further embodiment of a modular housing wall 1. In this embodiment, the use of a filling profile is dispensed with, in a preferred manner. In this case as well, the cover element 2 has an essentially U-shaped cross section as well as latching means 5 which are in the form of edges which run in the longitudinal direction and are bent inwards. In this case, bent edges 2 which are bent at right angles to the base surface 3 of the cover element 2 form the side limbs 16a of its U-shaped cross-sectional profile. However, the side limbs 16a of the U-shaped profile have horizontal bulges 4, which point outwards, at the junction with the base surface 3. The outward bulges 4 represent a linear contact in the assembled state, between two adjacent cover elements 2, and thus form a very simple seal against dust and water splashes. Since a filling profile is dispensed with in a preferred manner, the latching rail 10 in this case also has no supporting lugs 18, but only lugs 11 arranged at periodically recurring intervals for attachment of the cover elements 2, with the lugs 11 having notches 13a with which the latching means 5 can be engaged for hooking in one of the cover elements 2 on the latching rail 10. This use is particularly suitable for the indoor area, but generally does not provide EMC protection. This embodiment has the advantage that the cover elements 2 can be removed and replaced independently of one another. FIG. 11b shows a further variant of the embodiment described in FIG. 11a with additional seals 20a between two adjacent cover elements 2. The seals 20a are positioned on the side limbs 16a underneath the two outward bulges 4 of the cover elements 2 and offer a higher degree of ingress protection against dust and moisture, as well as additional EMC protection, if required, in an electrically conductive embodiment.

LIST OF REFERENCE SYMBOLS

1 Modular housing wall
2 Cover element
3 Base surface
4 Outward bulge
5 Latching means
7 Module
8 Half module
10 Latching rail
11 Lug
12a, b Rounded outline
13a, b Notches
14 Arrow
15 Filling profile
16a, b Side limbs
17 Bent edges
18 Supporting lug
19 Freestanding end
20a, b, c Seal
22 Shielding spring elements
23 Slots
25 Housing profile
27 Linear contact surfaces
29 Air-permeable separating wall
30 Openings
b Width of the smallest cover element (size order "1")
B Width of a cover element (size order "n")
$B_F$ Width of a filling profile

The invention claimed is:

1. A modular housing wall for telecommunications and data technology devices comprising:
    at least one cover element in order to form a flat wall section; and
    at least one latching rail for fixing the at least one cover element,
    wherein the at least one cover element has, at least in places, a U-shaped cross section with a plurality of latching means, and
    wherein the latching rail has attachment means with which the latching means engage in order to hook the cover element in on the latching rail, the attachment means having notches.

2. The housing wall as claimed in claim 1, wherein the latching means are in the form of edges which run in a longitudinal direction of the cover element and are bent inwards.

3. The housing wall as claimed in claim 1, wherein at least one latching means is in the form of an edge which runs in a longitudinal direction of the cover element and is curved outwards.

4. The housing wall as claimed in claim 1, wherein the attachment means are arranged with a periodically recurring grid spacing on the latching rail.

5. The housing wall as claimed in claim 4, wherein each of the cover elements has a width in a lateral direction by means of which a plurality of the attachment means can in each case be covered, with the latching means of the cover elements engaging with in each case one of the notches in at least two different ones of the attachment means.

6. The housing wall as claimed in claim 1, wherein the attachment means are in the form of lugs arranged on the latching rail, with the notches in each case being arranged at the junction between the latching rail and the lug.

7. The housing wall as claimed in claim 6, wherein the lugs have at least partially rounded outlines at their freestanding ends.

8. The housing wall as claimed in claim 1, wherein at least one U-shaped filling profile is provided, and the latching rail has at least one supporting lug, with the filling profile being arranged alongside the at least one cover element on the latching rail and engaging at least in an interlocking form with the supporting lug for attachment.

9. The housing wall as claimed in claim 8, wherein the filling profile has a plurality of second latching means and the at least one supporting lug has notches at its junction with the latching rail.

10. The housing wall as claimed in claim 8, wherein a filling profile is in each case arranged between two cover elements.

11. The housing wall as claimed in claim 8, wherein the filling profile has a plurality of second latching means and the at least one supporting lug has an outline which is rounded at least in places at its freestanding end.

12. The housing wall as claimed in claim 1, wherein at least one seal is in each case provided in an intermediate space between at least one of the following pairs: two of the cover elements, the at least one cover element and at least one housing profile, the at least one cover element and the at least one filling profile, and the at least one filling profile and the at least one housing profile.

13. The housing wall as claimed in claim 12, wherein the seal has an inner core composed of an elastic material whose circumference is sheathed by a conductive fabric.

14. The housing wall as claimed in claim 12, wherein side limbs of the U-shaped cross section of the at least one filling profile or of the at least one cover element are concave.

15. The housing wall as claimed in claim 1, wherein at least a surface of the housing wall has electrically conductive characteristics.

16. The housing wall as claimed in claim 15, wherein slots are defined in side limbs of at least one of the U-shaped cover element and the U-shaped filling profile, the slots having a periodically recurring grid spacing in a longitudinal direction in order to produce shielding spring elements.

17. The housing wall as claimed in claim 16, wherein a width of the shielding spring elements in a longitudinal direction and a gap length of the slots is in each case $\lambda/10$ of the highest frequency to be shielded against.

18. The housing wall as claimed in claim 1, wherein at least one of the cover element and the at least one filling profile has at least one area which is perforated at regular intervals.

19. The housing wall as claimed in claim 1, wherein at least one of the cover element and the at least one filling profile is formed at least in places from a wire mesh.

20. The housing wall as claimed in claim 1, wherein at least one of the cover element and the at least one filling profile has openings for holding cable bushings.

21. A method for producing a modular housing wall for telecommunications and data technology devices, the method comprising:
fixing at least one cover element on at least one latching rail in order to form a flat wall section, the at least one cover element having, at least in places, a U-shaped cross section with a plurality of latching means, and the latching rail having attachment means with notches,
wherein fixing the at least one cover element to the at least one latching rail includes engaging the latching means with the attachment means to hook the cover element on the latching rail.

22. A modular housing wall for telecommunications and data technology devices comprising:
a first latching rail including a plurality of lugs extending outwardly from the first latching rail, the lugs extending from first ends at the first latching rail to second ends opposite the first latching rail, each lug defining first and second notches at the first end, first and second rounded contours at the second end, and first and second latching surfaces between the first and second ends; and
a first cover element including first and second side limbs extending from a base surface, the first and second side limbs each defining an inwardly bent edges opposite the base surface;
wherein the inwardly bent edge of the first side limb is configured to ride over the first rounded contour of a first of the lugs of the first latching rail and latch onto the first latching surface of the first lug; and
wherein the inwardly bent edge of the second side limb is configured to ride over the second rounded contour of the first lug and latch onto the second latching surface of the first lug.

23. The modular housing wall as claimed in claim 22, wherein the lugs of the first latching rail are integrally formed with the first latching rail.

24. The modular housing wall as claimed in claim 22, further comprising:
a second cover element including first and second side limbs extending from a base surface, the first and second side limbs each defining inwardly bent edges opposite the base surface;
wherein the inwardly bent edge of the first side limb of the second cover element is configured to ride over the first rounded contour of a second of the lugs of the first latching rail and latch onto the first latching surface of the second lug; and
wherein the inwardly bent edge of the second side limb of the second cover element is configured to ride over the second rounded contour of a third of the lugs of the first latching rail and latch onto the second latching surface of the third lug.

25. The modular housing wall as claimed in claim 24, wherein the first latching rail includes at least one supporting lug positioned between the second and third lugs.

26. The modular housing wall as claimed in claim 22, wherein the first latching rail includes at least one supporting lug positioned between two of the lugs.

27. The modular housing wall as claimed in claim 26, further comprising at least one filling profile configured to mount to the supporting lug, the filling profile including side limbs that contour inwardly and have bent ends.

* * * * *

UNITED STATES PATENT AND TRADEMARK OFFICE
CERTIFICATE OF CORRECTION

PATENT NO. : 7,838,767 B2  
APPLICATION NO. : 11/995661  
DATED : November 23, 2010  
INVENTOR(S) : Delakowitz It is certified that error appears in the above-identified patent and that said Letters Patent is hereby corrected as shown below:

Col. 4, lines 36-37: "width: Module "1 "=1 ×cover element "1 "+1 ×filling profile=235 mm+15 mm=250 mm." should read --width: Module "1" = 1 × cover element "1" + 1 × filling profile = 35 mm + 15 mm = 50 mm.--

Col. 4, lines 41-42: "Module "5 "=1 ×cover element "5 "+1 ×filling profile=235 mm+15 mm=250 mm." should read --Module "5" = 1 × cover element "5" + 1 × filling profile = 235 mm + 15 mm = 250 mm.--

Col. 16, line 18, claim 22: "inwardly bent edges opposite" should read --inwardly bent edge opposite--

Signed and Sealed this  
Thirteenth Day of September, 2011

David J. Kappos  
*Director of the United States Patent and Trademark Office*